United States Patent
Yang et al.

(10) Patent No.: US 11,257,809 B2
(45) Date of Patent: Feb. 22, 2022

(54) ELECTROSTATIC DISCHARGE CIRCUIT AND METHOD FOR PREVENTING MALFUNCTIONING OF INTEGRATED CIRCUIT FROM REVERSE CONNECTION OF POWER SOURCE

(71) Applicant: Audiowise Technology Inc., Hsinchu (TW)

(72) Inventors: Tsung-Han Yang, Hsinchu (TW); Chia-So Chuang, Hsinchu (TW)

(73) Assignee: AUDIOWISE TECHNOLOGY INC., Hsinchu (TW)

(*) Notice: Subject to any disclaimer, the term of this patent is extended or adjusted under 35 U.S.C. 154(b) by 0 days.

(21) Appl. No.: 17/069,936

(22) Filed: Oct. 14, 2020

(65) Prior Publication Data

US 2021/0320100 A1 Oct. 14, 2021

(30) Foreign Application Priority Data

Apr. 9, 2020 (CN) .......................... 202010272917.2

(51) Int. Cl.
*H01L 27/02* (2006.01)
*H02H 9/04* (2006.01)

(52) U.S. Cl.
CPC ...... *H01L 27/0266* (2013.01); *H01L 27/0288* (2013.01); *H02H 9/046* (2013.01)

(58) Field of Classification Search
CPC ............. H01L 27/0266; H01L 27/0285; H01L 27/0288; H02H 9/046
See application file for complete search history.

(56) References Cited

U.S. PATENT DOCUMENTS

| | | | |
|---|---|---|---|
| 2012/0250198 A1* | 10/2012 | Sudo | H01L 27/0266 361/56 |
| 2017/0366004 A1* | 12/2017 | Nishikawa | H03K 19/00315 |
| 2019/0103397 A1* | 4/2019 | Chuang | H01L 27/0266 |

* cited by examiner

*Primary Examiner* — Jared Fureman
*Assistant Examiner* — Christopher J Clark
(74) *Attorney, Agent, or Firm* — Li & Cai Intellectual Property (USA) Office (57) ABSTRACT

Disclosed are an electrostatic discharge circuit and a method for preventing malfunctions of an integrated circuit due to a reverse connection of a power source. The electrostatic discharge circuit includes at least one MOSFET for providing an electrostatic discharging current path, and a control circuit coupled to the at least one MOSFET. When an external power supply is reversely connected, the control circuit is configured to change a potential of a body of at least one MOSFET, such that the at least one MOSFET is turned off, thereby preventing the integrated circuit from malfunctioning caused by a current generated by the reverse connection of the external power source flowing through the at least one MOSFET.

11 Claims, 4 Drawing Sheets

Using the control circuit to change a potential of a body of at least one MOSFET, such that the at least one MOSFET is turned off, thereby preventing the IC from the malfunctioning caused by a current generated by the reverse connection of the external power source flowing through the at least one MOSFET — S410

FIG. 4

ELECTROSTATIC DISCHARGE CIRCUIT AND METHOD FOR PREVENTING MALFUNCTIONING OF INTEGRATED CIRCUIT FROM REVERSE CONNECTION OF POWER SOURCE

CROSS-REFERENCE TO RELATED PATENT APPLICATION

This application claims the benefit of priority to China Patent Application No. 202010272917.2, filed on Apr. 9, 2020 in People's Republic of China. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to an electrostatic discharge (ESD) circuit, and more particularly to an ESD circuit and a method for preventing an integrated circuit (IC) from malfunctions due to a reverse connection of a power source.

BACKGROUND OF THE DISCLOSURE

An electrostatic discharge (ESD) circuit disposed inside an integrated circuit (IC) is used to prevent the IC from being damaged by ESD. However, during a production process, the IC may fail due to a reverse connection of an external power source connected thereto, and especially may malfunction due to an instantaneous large current, generated by the reverse connection of the external power source, flowing through an ESD current path, which can burn out pins or wires of the IC coupled to the external power source, or which may further cause damage to the ESD circuit or an internal circuit of the IC. Therefore, designing an ESD circuit and a method for preventing the IC from malfunctioning due to the reverse connection of the power source has become an important aim in the art.

SUMMARY OF THE DISCLOSURE

In response to the above-referenced technical inadequacies, the present disclosure provides an electrostatic discharge circuit suitable for an integrated circuit, and coupled to an external power source through a first pin and a second pin, and a reverse connection of the external power source refers to the first pin and the second pin being coupled to a negative electrode and a positive electrode of the external power source, respectively. The ESD circuit includes at least one metal oxide semiconductor field effect transistor (MOSFET) and a control circuit. The at least one MOSFET is configured to provide an ESD current path to prevent the ESD current from flowing into an internal circuit of the IC while causing damages. The control circuit is coupled to the at least one MOSFET for changing a potential of a body of the at least one MOSFET when the external power source is reversely connected, such that the at least one MOSFET is turned off to prevent the integrated circuit from malfunctioning caused by a current generated by the reverse connection of the external power source flowing through the MOSFET.

In another aspect, the present disclosure provides a method for preventing malfunctions of an integrated circuit due to a reverse connection of a power source, and the method is performed in an ESD circuit of an IC. The ESD circuit is coupled to an external power source through a first pin and a second pin, and a reverse connection of the external power source refers to the first pin and the second pin being coupled to a negative electrode and a positive electrode of the external power source, respectively. The method includes the following steps. When an external power supply is reversely connected, the control circuit is configured to change a potential of a body of at least one MOSFET, such that the at least one MOSFET is turned off, thereby preventing the IC from the malfunctioning caused by a current generated by the reverse connection of the external power source flowing through the at least one MOSFET.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

It should be noted that an ESD circuit provided by an embodiment of the present disclosure can be applied to any IC. In short, the present disclosure does not limit a specific implementation of the IC, and those skilled in the art should be able to design the IC according to actual needs or applications.

Figure 1:
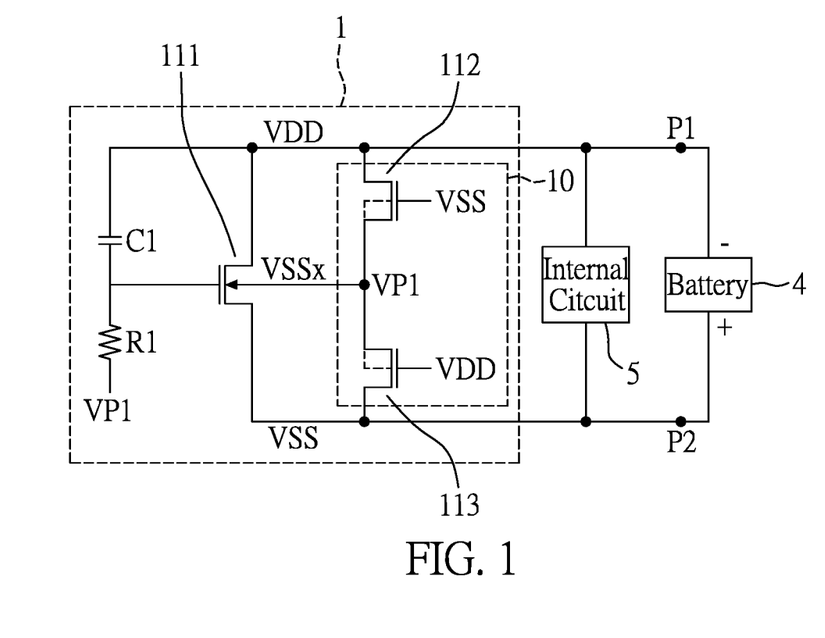
FIG. 1 is a circuit schematic diagram of an ESD circuit provided by a first embodiment of the present disclosure.

Reference is made to FIG. 1, which is a circuit schematic diagram of an ESD circuit provided by a first embodiment of the present disclosure. An ESD circuit 1 is coupled to an external power source 4 through a first pin P1 and a second pin P2, and in particular, the first pin P1 and the second pin P2 are usually connected to the external power source 4 in a wire bonding manner. In the present embodiment, the external power source 4 can be, for example, a battery, but the present disclosure is not limited thereto, and a reverse connection of the external power source 4 refers to the first pin P1 and the second pin P2 being respectively coupled to a negative electrode and a positive electrode of the battery, as shown in FIG. 1.

The ESD circuit 1 includes a control circuit 10 and a MOSFET 111 for providing an ESD current path, thereby preventing the ESD current flowing into the internal circuit 5 of the IC from causing damage. That is, the IC of the present embodiment includes the internal circuit 5 and the ESD circuit 1, and the internal circuit 5 and the ESD circuit 1 are coupled in parallel between the first pin P1 receiving a power voltage VDD and the second pin P2 receiving a ground voltage VSS.

In addition, the control circuit 10 is coupled to the MOSFET 111 for changing a potential of a body of the MOSFET 111 when the external power supply 4 (battery) is reversely connected, such that the MOSFET 111 is turned off, thereby preventing the IC from malfunctioning caused by an instantaneous large current generated by the reverse connection of the external power supply 4 (battery) flowing through the MOSFET 111. As described above, the malfunctions of the IC in the present embodiment can refer to the instantaneous large current burning out the first pin P1, the second pin P2, or the wires through which the IC is coupled to the external power supply 4 (battery).

For the convenience of the following description, the MOSFET 111 used in FIG. 1 to provide the ESD current path can first be an N-type MOSFET, but the present disclosure is not limited thereto. In a case where the N-type MOSFET is utilized to provide the ESD current path, the ESD circuit 1 can further include a capacitor C1 and a resistor R1. A first terminal of the capacitor C1 and a drain (D) of the MOSFET 111 are commonly coupled to the first pin P1 receiving the power voltage VDD, and a second terminal of the capacitor C1 is coupled to a gate (G) of the MOSFET 111.

It should be noted that the present disclosure does not limit a specific implementation of the capacitor C1. In other embodiments, the capacitor C1 can also be a polarized capacitor, and the first and second terminals of the capacitor C1 refer to positive and negative terminals of the polarized capacitors, respectively. In addition, a first terminal of the resistor R1 and the second terminal of the capacitor C1 can be commonly coupled to the gate (G) of the MOSFET 111, and a second terminal of the resistor R1 is coupled to a transformer node VP1.

In this way, when ESD occurs at the first pin P1, that is, the first pin P1 receives a positive electrostatic voltage, due to a high voltage characteristic of the positive electrostatic voltage, a voltage difference will be generated on the capacitor C1, and due to an existence of this voltage difference, an ON-time for the MOSFET 111 at about several hundred milliseconds will be generated. Therefore, a parasitic diode will be conducted to discharge the ESD current, and the turned on MOSFET 111 will also provide a conduction path, that is, the ESD current path, for jointly discharging the ESD current to achieve an effect of ESD protection. Since operation principles of the MOSFET 111, the capacitor C1, and the resistor R1 are known to those skilled in the art, details thereof will not be repeated hereinafter.

It should be noted that in order to be able to change the potential of the body of the MOSFET 111 when the external power supply 4 (battery) is reversely connected, the MOSFET 111 is turned off to prevent the IC from malfunctioning caused by a current generated by the reverse connection of the external power supply 4 (battery) flowing through the MOSFET 111, the control circuit 10 of FIG. 1 can include an N-type MOSFET 112 and an N-type MOSFET 113. In this embodiment, a drain (D) of the N-type MOSFET 112 is coupled to the first pin P1 receiving the power voltage VDD, and a gate (G) of the N-type MOSFET 112 receives the ground voltage VSS.

In addition, a source (S) of the N-type MOSFET 113 and a source (S) of the N-type MOSFET 112 are coupled to the body of the MOSFET 111 commonly through the transformer node VP1, a gate (G) of the N-type MOSFET 113 receives the power voltage VDD, and a drain (D) of the N-type MOSFET 113 and the source (S) of the MOSFET 111 are commonly coupled to the second pin P2 receiving the ground voltage VSS. Since operation principles of the N-type MOSFET 112 and the N-type MOSFET 113 are also known to those skilled in the art, and details thereof will not be repeated hereinafter.

It can be observed that, unlike the existing ESD circuit, where the current path may be changed when the external power supply 4 (battery) is reversely connected, the ESD circuit 1 of FIG. 1 utilizes the N-type MOSFET 112 and the N-type MOSFET 113 to allow the body of the MOSFET 111 to receive a low voltage, for example, VSSx, and since the second terminal of the resistor R1 is coupled to the transformer node VP1, the second terminal of the resistor R1 and the body of the MOSFET 111 have the same potential, i.e., the voltage VSSx, such that the parasitic diode is not conducted, and the MOSFET 111 is turned off, so as to prevent the IC from malfunctioning caused by the current generated by the reverse connection of the external power source 4 (battery) flowing through the MOSFET 111. In addition, reference is made to FIG. 2, which is a circuit schematic diagram of an ESD circuit provided by a second embodiment of the present disclosure. Certain components in FIG. 2 are the same as those in FIG. 1, and therefore details thereof are omitted hereinafter.

Figure 2:
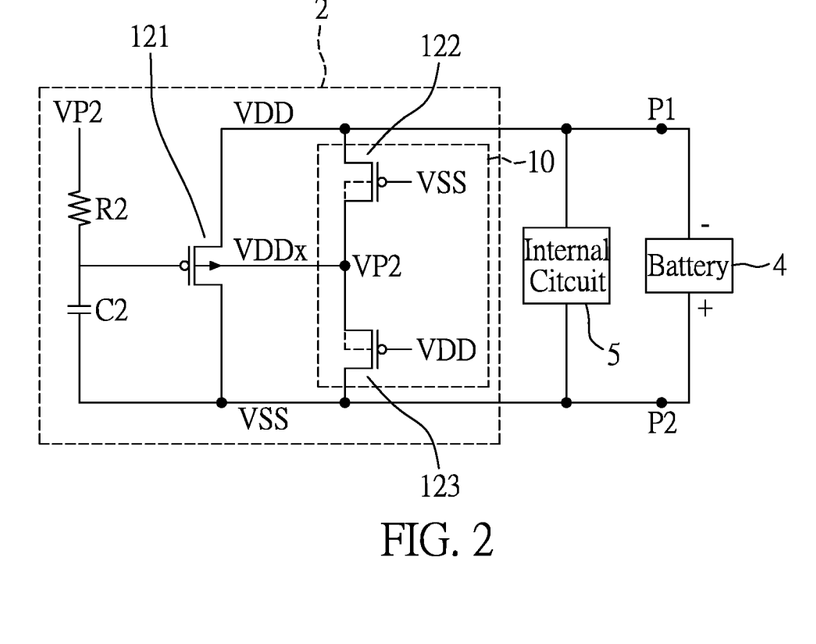
FIG. 2 is a circuit schematic diagram of an ESD circuit provided by a second embodiment of the present disclosure.

As shown in FIG. 2, the internal circuit 5 and an ESD circuit 2 are also coupled in parallel between the first pin P1 and the second pin P2 similarly, and the ESD circuit 2 is coupled to the external power supply 4 (battery) through the first pin P1 and the second pin P2. However, unlike the MOSFET 111 shown in FIG. 1, a MOSFET 121 used in FIG. 2 to provide an ESD current path is, for example, a P-type MOSFET, but the present disclosure is not limited thereto. Since the P-type MOSFET is used to provide the ESD current path, the ESD circuit 2 can further include a resistor R2 and a capacitor C2.

A first terminal of the resistor R2 is coupled to a transformer node VP2, and a second terminal of the resistor R2 is coupled to a gate (G) of the MOSFET 121. In addition, a first terminal of the capacitor C2 and the second terminal of the resistor R2 can be commonly coupled to the gate (G) of the MOSFET 121, and a second terminal of the capacitor C2 and a drain (D) of the P-type MOSFET 121 are commonly coupled to the second pin P2 receiving the ground voltage VSS. As mentioned above, in other embodiments, the capacitor C2 can also be a polarized capacitor, and the first terminal and the second terminal of the capacitor C2 refer to positive and negative terminals of the polarized capacitor, respectively, but the present disclosure is not limited thereto.

In this way, when ESD occurs at the first pin P1, that is, the first pin P1 receives a positive electrostatic voltage, due to a high voltage characteristic of the positive electrostatic voltage, a voltage difference will be generated on the capacitor C2, and due to an existence of this voltage difference, an ON-time for the MOSFET 121 at about several hundred milliseconds will be generated. Therefore, a parasitic diode will be conducted to discharge the ESD current, and the turned on MOSFET 121 will also provide a conduction path, that is, the ESD current path, for jointly discharging the ESD current to achieve the effect of ESD protection. Since operation principles of the MOSFET 121, the resistor R2 and the capacitor C2 are known to those skilled in the art, the details will not be repeated hereinafter.

Similarly, in order to be able to change the potential of the body of the MOSFET 121 when the external power supply 4 (battery) is reversely connected, the MOSFET 121 is turned off accordingly to prevent the IC from malfunctioning caused by a current generated by the reverse connection of the external power supply 4 (battery) flowing through the MOSFET 121, and the control circuit 10 of FIG. 2 can include a P-type MOSFET 122 and a P-type MOSFET 123. In the present embodiment, a drain (D) of the P-type MOSFET 122 and the source (S) of the MOSFET 121 are commonly coupled to the first pin P1 receiving the power supply voltage VDD, and a gate (G) of the P-type MOSFET 122 receives the ground voltage VSS.

In addition, a source (S) of the P-type MOSFET 123 and a source (S) of the N-type MOSFET 122 are coupled to the body of the MOSFET 121 commonly through the transformer node VP2, a gate (G) of the P-type MOSFET 123 receives the power voltage VDD, and a drain (D) of the P-type MOSFET 123 is coupled to the second pin P2 receiving the ground voltage VSS. Since operation principles of the P-type MOSFET 122 and the P-type MOSFET 123 are also known to those skilled in the art, details thereof will not be repeated hereinafter.

It can be observed that, unlike the existing ESD circuit that the current path may be changed when the external power supply 4 (battery) is reversely connected, the ESD circuit 2 of FIG. 2 utilizes the P-type MOSFET 122 and the P-type MOSFET 123 to allow the body of the MOSFET 121 to receive a low voltage, for example, VDDx, and since the first terminal of the resistor R2 is coupled to the transformer node VP2, causing the first terminal of the resistor R2 and the body of the MOSFET 121 have the same potential, i.e., the voltage VDDx, such that the parasitic diode is not conducted, and the MOSFET 121 is turned off, so as to prevent the IC from malfunctioning caused by the current flowing generated by the reverse connection of the external power source 4 (battery) through the MOSFET 121.

Figure 3:
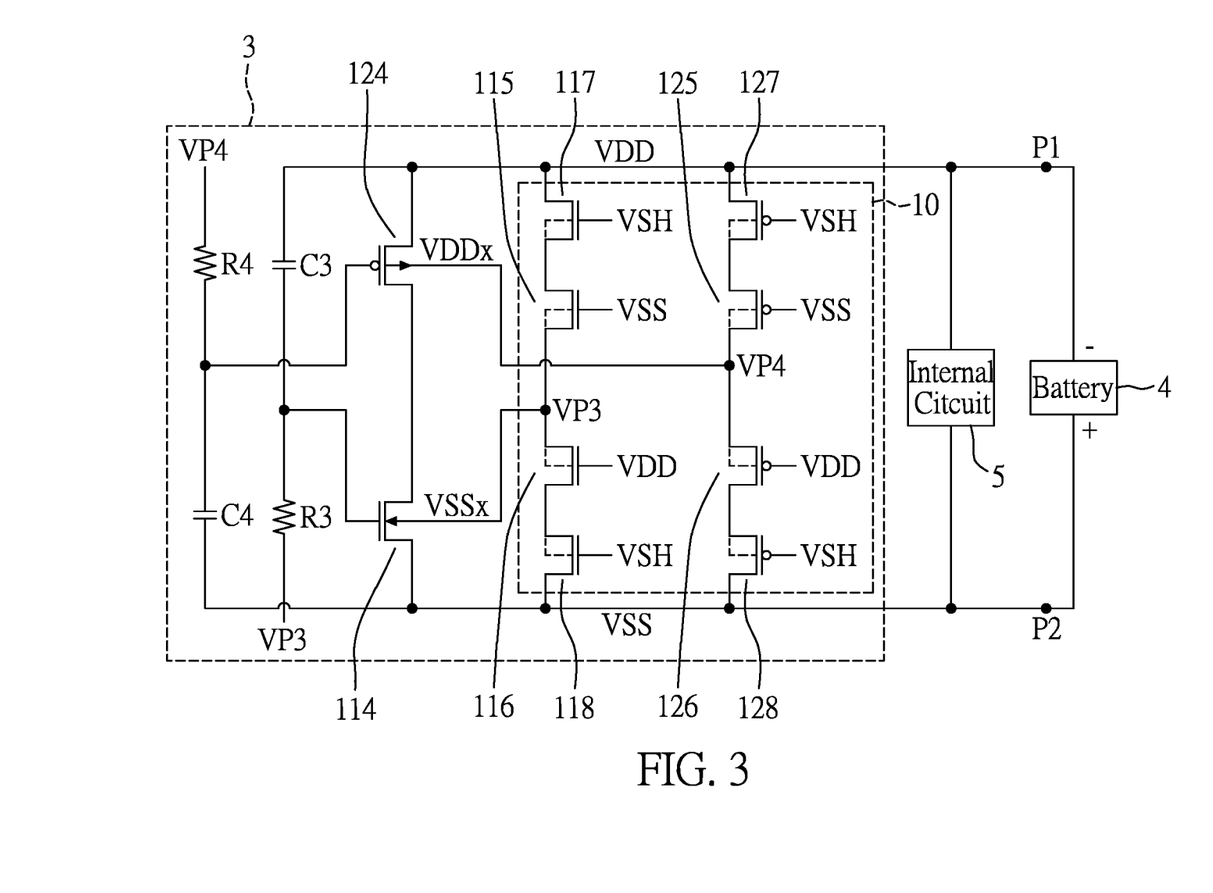
FIG. 3 is a circuit schematic diagram of an ESD circuit provided by a third embodiment of the present disclosure.

Finally, reference is made to FIG. 3, which is a circuit schematic diagram of an ESD circuit provided by a third embodiment of the present disclosure, and components in FIG. 3 that are the same as those in FIG. 1 or FIG. 2 are denoted by the same reference numerals, and therefore the details thereof are omitted hereinafter. As shown in FIG. 3, the internal circuit 5 and an ESD circuit 3 are also coupled in parallel between the first pin P1 and the second pin P2, and the ESD circuit 3 is coupled to the external power supply 4 (battery) through the first pin P1 and the second pin P2. However, unlike the MOSFET 111 shown in FIG. 1 or the MOSFET shown in FIG. 2, MOSFETs 114 and 124 used in FIG. 3 to provide an ESD current path are, for example, an N-type MOSFET and a P-type MOSFET, but the present disclosure is not limited thereto.

In this embodiment, a drain (D) of the MOSFET 114 is coupled to a drain (D) of the MOSFET 124, and since the N-type MOSFET and the P-type MOSFET are used to provide the ESD current path, the ESD circuit 3 can further include a capacitor C3, a resistor R3, a resistor R4, and a capacitor C4. A first terminal of the capacitor C3 and a source (S) of the MOSFET 124 are coupled to the first pin P1 receiving the power voltage VDD, and a second terminal of the capacitor C3 is coupled to a gate (G) of the MOSFET 114.

In addition, a first terminal of the resistor R3 and the second terminal of the capacitor C3 can be commonly coupled to the gate (G) of the MOSFET 114, and a second terminal of the resistor R3 is coupled to a transformer node VP3. A first terminal of the resistor R4 is coupled to a transformer node VP4, and a second terminal of the resistor R4 is coupled to the gate (G) of the MOSFET 124. A first terminal of the capacitor C4 and the second terminal of the resistor R4 can be commonly coupled to the gate (G) of the MOSFET 124, and a second terminal of the capacitor C4 and the source (S) of the MOSFET 114 are commonly coupled to the second pin P2 receiving the ground voltage VSS.

In this way, when ESD occurs at the first pin P1, that is, the first pin P1 receives a positive electrostatic voltage, due to a high voltage characteristic of the positive electrostatic voltage, voltage differences will be generated on the capacitors C3 and C4, and due to existences of these two voltage differences, ON-times for the MOSFETs 114 and 124 at about several hundred milliseconds will be generated. Therefore, parasitic diodes will be conducted to discharge the ESD current, and the turned on MOSFETs 114 and 124 will also provide conduction paths, that is, the ESD current paths, for jointly discharging the ESD current to achieve the effect of ESD protection. Since the operational details are as described above, the repeated descriptions are omitted hereinafter.

Similarly, in order to be able to change the potentials of the bodies of the MOSFETs 114 and 124 when the external power supply 4 (battery) is reversely connected, the MOSFETs 114 and 124 are turned off accordingly to prevent the IC from malfunctioning caused by a current generated by the reverse connection of the external power supply 4 (battery) flowing through the MOSFETs 114 and 124, and the control circuit 10 of FIG. 3 can include N-type MOSFETs 115, 116, 117 and 118 and P-type MOSFETs 125, 126, 127 and 128.

In this embodiment, a drain (D) of the N-type MOSFET 115 is coupled to the first pin P1 receiving the power voltage VDD, and a gate (G) of the N-type MOSFET 115 receives the ground voltage VSS. In addition, a source (S) of the N-type MOSFET 116 and a source (S) of the N-type MOSFET 115 are coupled to the body of the MOSFET 114 commonly through the transformer node VP3, a gate (G) of the N-type MOSFET 116 receives the power voltage VDD, and a drain (D) of the N-type MOSFET 116 is coupled to the second pin P2 receiving the ground voltage VSS.

In contrast, a drain (D) of the P-type MOSFET 125 is coupled to the first pin P1 receiving the power voltage VDD, and a gate (G) of the P-type MOSFET 125 receives the ground voltage VSS. In addition, a source (S) of the P-type MOSFET 126 and a source (S) of the P-type MOSFET 125 are coupled to the body of the MOSFET 124 commonly through the transformer node VP4, a gate (G) of the P-type MOSFET 126 receives the power voltage VDD, and a drain (D) of the P-type MOSFET 126 is coupled to the second pin P2 receiving the ground voltage VSS.

Furthermore, the N-type MOSFET 117 is connected in series between the first pin P1 and the N-type MOSFET 115. A drain (D) of the N-type MOSFET 117 is coupled to the first pin P1 receiving the power supply voltage VDD, a gate (G) of the N-type MOSFET 117 receives a shielding voltage VSH, and a source (S) of the N-type MOSFET 117 is coupled to the drain (D) of the N-type MOSFET 115.

The N-type MOSFET 118 is connected in series between the second pin P2 and the N-type MOSFET 116. A drain (D) of the N-type MOSFET 118 is coupled to the second pin P2 receiving the ground voltage VSS, a gate (G) of the N-type MOSFET 118 receives the shielding voltage VSH, and a source (S) of the N-type MOSFET 118 is coupled to the drain (D) of the N-type MOSFET 116.

In contrast, the P-type MOSFET 127 is connected in series between the first pin P1 and the P-type MOSFET 125. A drain (D) of the P-type MOSFET 127 is coupled to the first pin P1 receiving the power voltage VDD, a gate (G) of the P-type MOSFET 127 receives the shielding voltage VSH, and a source (S) of the P-type MOSFET 127 is coupled to the drain of the P-type MOSFET 125.

The P-type MOSFET 128 is connected in series between the second pin P2 and the P-type MOSFET. A drain (D) of the P-type MOSFET 128 is coupled to the second pin P2 receiving the ground voltage VSS, a gate (G) of the P-type MOSFET 128 receives the shielding voltage VSH, and a source (S) of the P-type MOSFET 128 is coupled to the drain of the P-type MOSFET 126. Since operation principles of the N-type MOSFETs 115-118 and the P-type MOSFET 125-158 are also known to those skilled in the art, the details will not be repeated hereinafter.

In practice, the shielding voltage VSH can be, for example, a voltage obtained by subtracting the ground voltage VSS from the power supply voltage VDD and then dividing by 2, but the present disclosure is not limited thereto. In short, unlike the existing ESD circuit that the current path may be changed when the external power supply 4 (battery) is reversely connected, the ESD circuit 3 of FIG. 3 utilizes the N-type MOSFETs 115-118 and the P-type MOSFETs 125-128 to allow the bodies of the MOSFETs 114 and 124 to receive low voltages, respectively, for example, voltages VSSx and VDDx, thereby making the second terminal of the resistor R3 and the body of the MOSFET 114 have the same potentials, i.e., the voltage VSSx, and also making the first terminal of the resistor R4 and the body of the MOSFET 124 have same potentials, such that the parasitic diode is not conducted, and the MOSFETs 114 and 124 are turned off, so as to prevent the IC from malfunctioning caused by the current generated by the reverse connection of the external power source 4 (battery) flowing through the MOSFETs 114 and 124.

Figure 4:
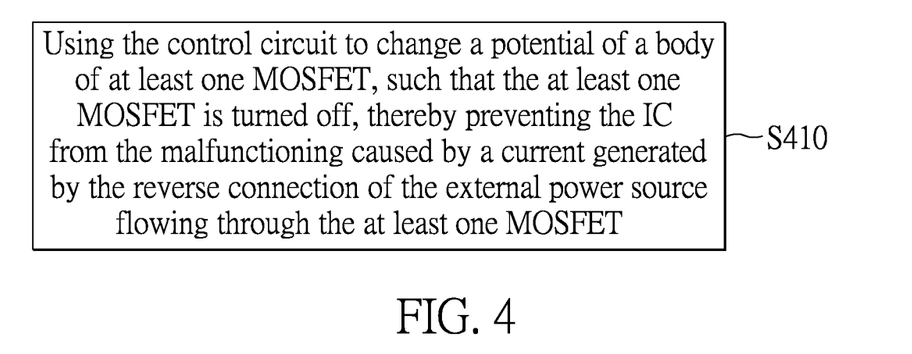
FIG. 4 is a flowchart of steps of a method for preventing an IC from malfunctioning due to a reverse connection of a power source according to an embodiment of the present disclosure.

On the other hand, reference is made to FIG. 4, which is a flowchart of steps of a method for preventing an IC from malfunctioning due to a reverse connection of a power source according to an embodiment of the present disclosure. It should be noted that the method of FIG. 4 can be implemented in the ESD circuit 1 in FIG. 1, the ESD circuit 2 in FIG. 2, or the ESD circuit 3 in FIG. 3, and therefore reference is also made to FIGS. 1-3 for better understanding. The present disclosure does not limit that the method of FIG. 4 can only be implemented in ESD circuits 1, 2, or 3.

As shown in FIG. 4, when an external power supply 4 (battery) is reversely connected, the ESD circuit 1, 2 and 3 can configure the control circuit to change a potential of a body of at least one MOSFET, such that the at least one MOSFET is turned off, thereby preventing the IC from the malfunctioning caused by a current generated by the reverse connection of the external power source 4 (battery) flowing through the at least one MOSFET. Since the details are as described above, the repeated descriptions are omitted hereinafter.

In conclusion, embodiments of the present disclosure provide an ESD circuit and a method for preventing an IC from malfunctioning due to a reverse connection of a power source. The ESD circuit includes at least one MOSFET for providing an ESD current path, and a control circuit coupled to the at least one MOSFET. When an external power supply is reversely connected, the control circuit is configured to change a potential of a body of at least one MOSFET, such that the at least one MOSFET is turned off, thereby preventing the integrated circuit from malfunctioning caused by a current generated by the reverse connection of the external power source flowing through the at least one MOSFET.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. An electrostatic discharge circuit suitable for an integrated circuit, and coupled to an external power source through a first pin and a second pin, wherein a reverse connection of the external power source refers to the first pin and the second pin being coupled to a negative electrode and a positive electrode of the external power source, respectively, and the electrostatic discharge circuit comprising:
    at least one metal oxide semiconductor field effect transistor (MOSFET) configured to provide an electrostatic discharging current path to prevent an electrostatic discharge current from flowing into an internal circuit of the integrated circuit while causing damages; and
    a control circuit coupled to the at least one MOSFET for changing a potential of a body of the at least one MOSFET when the external power source is reversely connected, wherein the at least one MOSFET is turned off accordingly to prevent the integrated circuit from malfunctioning caused by a current generated by the reverse connection of the external power source flowing through the MOSFET; wherein the at least one MOSFET is a first N-type MOSFET, and the electrostatic discharge circuit further comprises:
a capacitor having a first terminal and a second terminal, wherein the first terminal of the capacitor and a drain of the first N-type MOSFET are commonly coupled to the first pin receiving a power voltage, and the second terminal of the capacitor is coupled to a gate of the first N-type MOSFET; and
a resistor having a first terminal and a second terminal, wherein the first terminal of the resistor and the second terminal of the capacitor are commonly coupled to the gate of the first N-type MOSFET, and the second terminal of the resistor is coupled to a transformer node.

2. The electrostatic discharge circuit according to claim 1, wherein the control circuit includes:
a second N-type MOSFET having a drain coupled to the first pin receiving the power voltage, and a gate receiving a ground voltage; and
a third N-type MOSFET having a source, a gate and a source, wherein the source of the third N-type MOSFET and the source of the second N-type MOSFET are coupled to a body of the first N-type MOSFET commonly through the transformer node, the gate of the third N-type MOSFET receives the power voltage, and the drain of the third N-type MOSFET and the source of the first N-type MOSFET are commonly coupled to the second pin receiving the ground voltage.

3. The electrostatic discharge circuit according to claim 2, wherein when the external power source is reversely connected, the control circuit is configured to utilize the second N-type MOSFET and the third N-type MOSFET to allow the body of the first N-type MOSFET to receive a low voltage, and to cause the second terminal of the resistor and the body of the first N-type MOSFET have the same potential, such that a parasitic diode is not conducted, and the first N-type MOSFET is turned off, so as to prevent the integrated circuit from malfunctioning caused by the current generated by the reverse connection of the external power source flowing through the first N-type MOSFET.

4. An electrostatic discharge circuit suitable for an integrated circuit, and coupled to an external power source through a first pin and a second pin, wherein a reverse connection of the external power source refers to the first pin and the second pin being coupled to a negative electrode and a positive electrode of the external power source, respectively, and the electrostatic discharge circuit comprising:
at least one metal oxide semiconductor field effect transistor (MOSFET) configured to provide an electrostatic discharging current path to prevent an electrostatic discharge current from flowing into an internal circuit of the integrated circuit while causing damages; and
a control circuit coupled to the at least one MOSFET for changing a potential of a body of the at least one MOSFET when the external power source is reversely connected, wherein the at least one MOSFET is turned off accordingly to prevent the integrated circuit from malfunctioning caused by a current generated by the reverse connection of the external power source flowing through the MOSFET; wherein the at least one MOSFET is a first P-type MOSFET, and the electrostatic discharge circuit further comprises:
a resistor having a first terminal coupled to a transformer node, and a second terminal coupled to a gate of the first P-type MOSFET; and
a capacitor having a first terminal and a second terminal, wherein the first terminal of the capacitor and the second terminal of the resistor are commonly coupled to the gate of the first P-type MOSFET, and the second terminal of the capacitor and a drain of the first P-type MOSFET are commonly coupled to the second pin receiving a ground voltage.

5. The electrostatic discharge circuit according to claim 4, wherein the control circuit includes:
a second P-type MOSFET having a drain and a gate, wherein the drain of the second P-type MOSFET and the drain of the first P-type MOSFET are commonly coupled to the first pin receiving a power voltage, and the gate of the second P-type MOSFET receives the ground voltage; and
a third P-type MOSFET having a source, a gate and a drain, wherein the source of the third P-type MOSFET and a source of the second P-type MOSFET are coupled to a body of the first P-type MOSFET commonly through the transformer node, the gate of the third P-type MOSFET receives the power voltage, and the drain of the third P-type MOSFET is coupled to the second pin receiving the ground voltage.

6. The electrostatic discharge circuit according to claim 5, wherein when the external power source is reversely connected, the control circuit is configured to utilize the second P-type MOSFET and the third P-type MOSFET to allow the body of the first P-type MOSFET to receive a low voltage, and cause the first terminal of the resistor and the body of the first N-type MOSFET have the same potential, such that a parasitic diode is not conducted, and the first P-type MOSFET is turned off, thereby preventing the integrated circuit from malfunctioning caused by the current generated by the reverse connection of the external power source flowing through the first P-type MOSFET.

7. An electrostatic discharge circuit suitable for an integrated circuit, and coupled to an external power source through a first pin and a second pin, wherein a reverse connection of the external power source refers to the first pin and the second pin being coupled to a negative electrode and a positive electrode of the external power source, respectively, and the electrostatic discharge circuit comprising:
at least one metal oxide semiconductor field effect transistor (MOSFET) configured to provide an electrostatic discharging current path to prevent an electrostatic discharge current from flowing into an internal circuit of the integrated circuit while causing damages; and
a control circuit coupled to the at least one MOSFET for changing a potential of a body of the at least one MOSFET when the external power source is reversely connected, wherein the at least one MOSFET is turned off accordingly to prevent the integrated circuit from malfunctioning caused by a current generated by the reverse connection of the external power source flowing through the MOSFET; wherein the at least one MOSFET is a first N-type MOSFET and a first P-type MOSFET, a drain of the first N-type MOSFET is coupled to a drain of the first P-type MOSFET, and the electrostatic discharge circuit further comprises:
a first capacitor having a first terminal and a second terminal, wherein the first terminal of the first capacitor and a source of the first P-type MOSFET are commonly coupled to the first pin receiving a power voltage, and the second terminal of the first capacitor is coupled to a gate of the first N-type MOSFET;
a first resistor having a first terminal and a second terminal, wherein the first terminal of the first resistor and the second terminal of the first capacitor are commonly coupled to the gate of the first N-type MOSFET, and the second terminal of the first resistor is coupled to a first transformer node;

a second resistor having a first terminal coupled to a second transformer node, and a second terminal coupled to a gate of the first P-type MOSFET; and a second capacitor having a first terminal and a second terminal, wherein the first terminal and the second terminal of the second resistor are commonly coupled to the gate of the first P-type MOSFET, and the second terminal and a source of the first N-type MOSFET are commonly coupled to the second pin receiving a ground voltage.

8. The electrostatic discharge circuit according to claim 7, wherein the control circuit includes:

a second N-type MOSFET having a drain coupled to the first pin receiving the power voltage, and a gate receiving the ground voltage;

a third N-type MOSFET having a source, a gate and a drain, wherein the source of the third N-type MOSFET and a source of the second N-type MOSFET are coupled to a body of the first N-type MOSFET commonly through the first transformer node, the gate of the third N-type MOSFET receives the power voltage, and the drain of the third N-type MOSFET is coupled to the second pin receiving the ground voltage;

a second P-type MOSFET having a drain coupled to the first pin receiving the power voltage, and a gate receiving the ground voltage; and a third P-type MOSFET having a source, a gate and a drain, wherein the source of the third P-type MOSFET and a source of the second P-type MOSFET are coupled to a body of the first P-type MOSFET, the gate of the third P-type MOSFET receives the power voltage, and the drain of the third P-type MOSFET is coupled to the second pin receiving the ground voltage.

9. The electrostatic discharge circuit according to claim 8, wherein the control circuit further includes:

a fourth N-type MOSFET connected between the first pin and the second N-type MOSFET, wherein a drain of the fourth N-type MOSFET is coupled to the first pin receiving the power voltage, a gate of the fourth N-type MOSFET receives a shielding voltage, and a source of the fourth N-type MOSFET is coupled to the drain of the second N-type MOSFET;

a fifth N-type MOSFET connected between the second pin and the third N-type MOSFET, wherein a drain of the fifth N-type MOSFET is coupled to the second pin receiving the ground voltage, a gate of the fifth N-type MOSFET receives the shielding voltage, and a source of the fifth N-type MOSFET is coupled to the drain of the third N-type MOSFET;

a fourth P-type MOSFET connected between the first pin and the second P-type MOSFET, wherein a drain of the fourth P-type MOSFET is coupled to the first pin receiving the power voltage, a gate of the fourth P-type MOSFET receives the shielding voltage, and a source of the fourth P-type is coupled to the drain of the second P-type MOSFET; and a fifth P-type MOSFET connected between the second pin and the third P-type MOSFET, wherein a drain of the fifth P-type MOSFET is coupled to the second pin receiving the ground voltage, a gate of the fifth P-type MOSFET receives the shielding voltage, and a source of the fifth P-type MOSFET is coupled to the drain of the third P-type MOSFET.

10. The electrostatic discharge circuit according to claim 9, wherein the shielding voltage is a voltage obtained by subtracting the ground voltage from the power voltage and dividing by 2.

11. The electrostatic discharge circuit according to claim 10, wherein when the external power source is reversely connected, the control circuit is configured to utilize the second N-type MOSFET, the third N-type MOSFET, the fourth N-type MOSFET, the fifth N-type MOSFET, the second P-type MOSFET, the third P-type MOSFET, the fourth P-type MOSFET and the fifth P-type MOSFET to allow the first N-type MOSFET and the first P-type MOSFET to receive low voltages, respectively, to cause the second terminal of the first resistor and the body of the first N-type MOSFET have the same potential, and to cause the first terminal of the second resistor and the body of the first P-type MOSFET have the same potential, such that a parasitic diode is not conducted, and the first N-type MOSFET and the first P-type MOSFET are turned off, so as to prevent the integrated circuit from malfunctioning caused by the current generated by the reverse connection of the external power source flowing through the first N-type MOSFET and the first P-type MOSFET.

* * * * *